(12) United States Patent
Nakashiba et al.

(10) Patent No.: US 8,810,021 B2
(45) Date of Patent: *Aug. 19, 2014

(54) SEMICONDUCTOR DEVICE INCLUDING A RECESS FORMED ABOVE A SEMICONDUCTOR CHIP

(75) Inventors: Yasutaka Nakashiba, Kanagawa (JP); Kenta Ogawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/620,799

(22) Filed: Sep. 15, 2012

(65) Prior Publication Data

US 2013/0043558 A1 Feb. 21, 2013

Related U.S. Application Data

(63) Continuation of application No. 13/067,548, filed on Jun. 8, 2011, now Pat. No. 8,283,770, which is a continuation of application No. 12/926,709, filed on Dec. 6, 2010, now Pat. No. 7,982,303.

(30) Foreign Application Priority Data

Dec. 15, 2009 (JP) ................. 2009-284350

(51) Int. Cl.
*H01L 23/52* (2006.01)
(52) U.S. Cl.
USPC ........................................ 257/691
(58) Field of Classification Search
CPC ..................................... H01L 21/563

USPC .................. 257/691, 678, 761, 724
See application file for complete search history.

(56) References Cited

U.S. PATENT DOCUMENTS

| 5,959,846 | A | 9/1999 | Noguchi et al. |
| 6,242,932 | B1* | 6/2001 | Hembree ............... 324/756.02 |
| 6,359,331 | B1 | 3/2002 | Rinehart et al. |
| 6,362,525 | B1 | 3/2002 | Rahim |
| 6,445,068 | B1 | 9/2002 | Sofue et al. |
| 6,836,025 | B2 | 12/2004 | Fujisawa et al. |
| 6,906,396 | B2* | 6/2005 | Tuttle et al. ................ 257/433 |

(Continued)

FOREIGN PATENT DOCUMENTS

| CN | 101 185 002 A | 5/2008 |
| JP | 2000-174170 A | 6/2000 |

(Continued)

OTHER PUBLICATIONS

Notification of Reason(s) for Rejection dated May 7, 2013, with English translation.

(Continued)

*Primary Examiner* — Nathan Ha
(74) *Attorney, Agent, or Firm* — McGinn IP Law Group, PLLC

(57) ABSTRACT

A semiconductor device, includes a substrate with a first surface, a semiconductor chip disposed over the first surface of the substrate, the semiconductor chip including a first region and a second region, and an encapsulant resin formed over the first surface of the substrate and encapsulating the semiconductor chip. The encapsulant resin has a thickness that is less at the first region of the semiconductor chip than that at the second region.

16 Claims, 15 Drawing Sheets

(56) References Cited

U.S. PATENT DOCUMENTS

| | | |
|---|---|---|
| 7,116,557 B1 | 10/2006 | Raby et al. |
| 7,138,706 B2 * | 11/2006 | Arai et al. ............... 257/678 |
| 7,195,940 B2 * | 3/2007 | Bolken et al. ............... 438/25 |
| 7,342,802 B2 * | 3/2008 | Iijima et al. ............... 361/760 |
| 7,361,986 B2 * | 4/2008 | Yuan et al. ............... 257/718 |
| 7,364,945 B2 * | 4/2008 | Shim et al. ............... 438/109 |
| 7,365,427 B2 * | 4/2008 | Lu et al. ............... 257/723 |
| 7,369,399 B2 * | 5/2008 | Richardson ............... 361/679.01 |
| 7,514,335 B2 | 4/2009 | Wakabayashi et al. |
| 7,517,726 B1 * | 4/2009 | Tan et al. ............... 438/114 |
| 7,727,803 B2 | 6/2010 | Yamagata |
| 7,808,085 B2 * | 10/2010 | Ozaki et al. ............... 257/667 |
| 7,968,979 B2 * | 6/2011 | Pagaila et al. ............... 257/660 |
| 8,008,699 B2 | 8/2011 | Hashimoto et al. |
| 8,138,590 B2 * | 3/2012 | Chow et al. ............... 257/680 |
| 8,399,960 B2 | 3/2013 | Nakagawa et al. |
| 2003/0124773 A1 | 7/2003 | Hashimoto |
| 2006/0220256 A1 | 10/2006 | Shim et al. |
| 2007/0114651 A1 | 5/2007 | Marimuthu et al. |
| 2008/0055873 A1 | 3/2008 | Mi et al. |
| 2008/0122051 A1 * | 5/2008 | Theuss ............... 257/678 |
| 2008/0205497 A1 | 8/2008 | Kahlman et al. |
| 2009/0072388 A1 | 3/2009 | Tews et al. |
| 2009/0315164 A1 * | 12/2009 | Chow et al. ............... 257/680 |

FOREIGN PATENT DOCUMENTS

| | | |
|---|---|---|
| JP | 2003-68941 A | 3/2003 |
| JP | 2006-203852 A | 8/2006 |
| JP | 2007-66960 A | 3/2007 |
| WO | WO 2009/113373 A1 | 9/2009 |

OTHER PUBLICATIONS

Chinese Notification of First Office Action, dated Jan. 9, 2014 English translation.

* cited by examiner

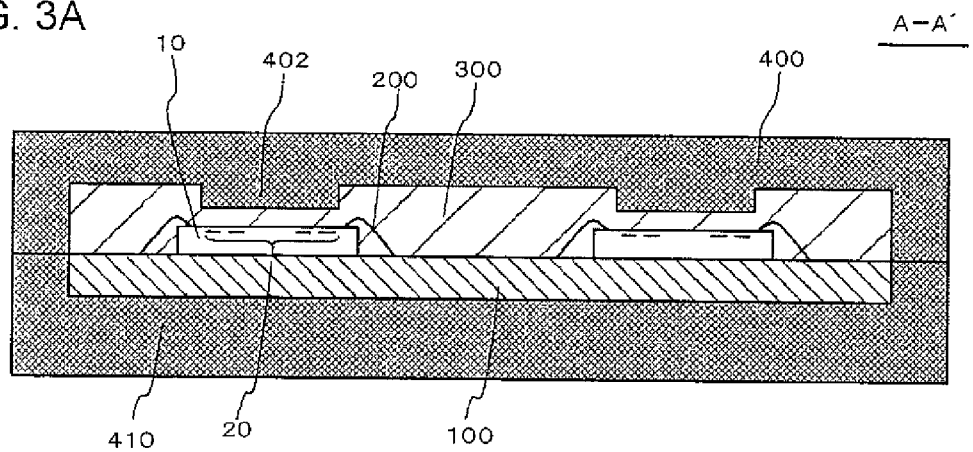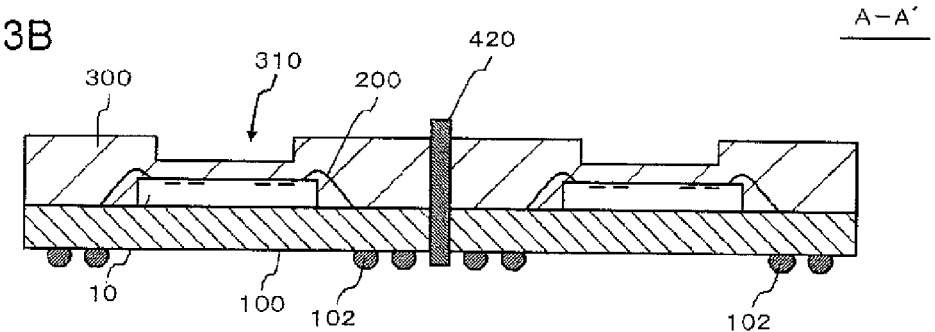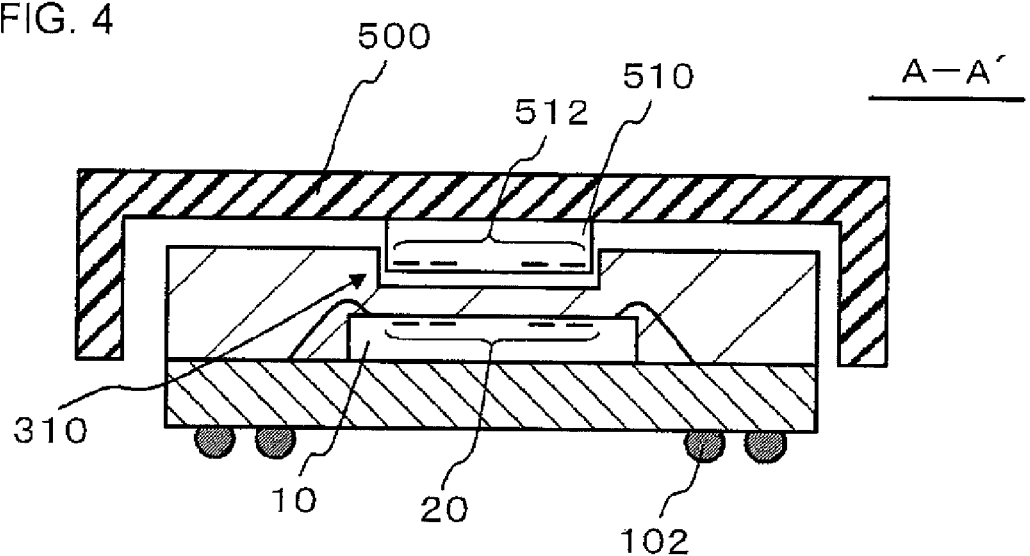

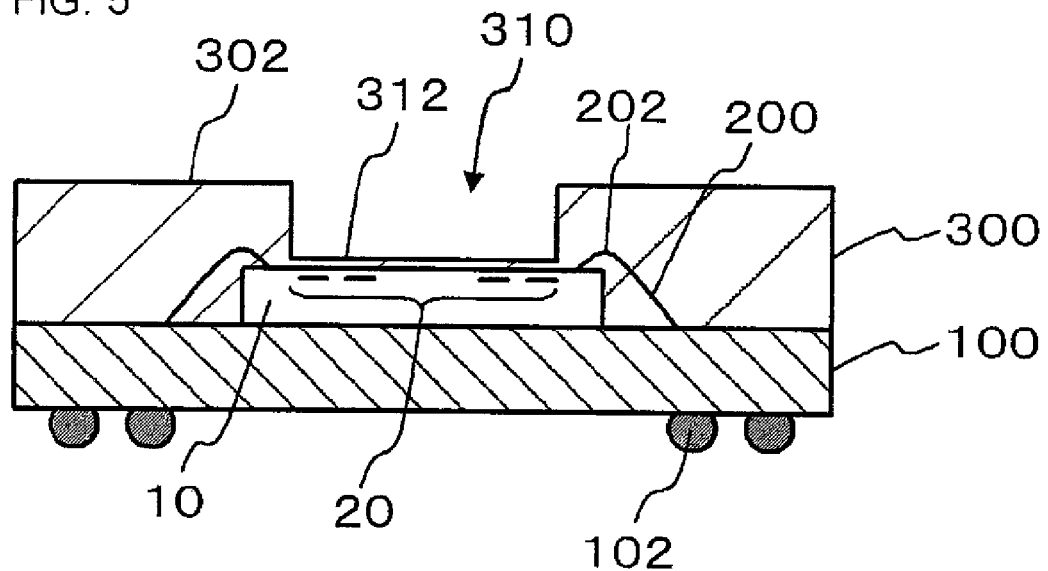
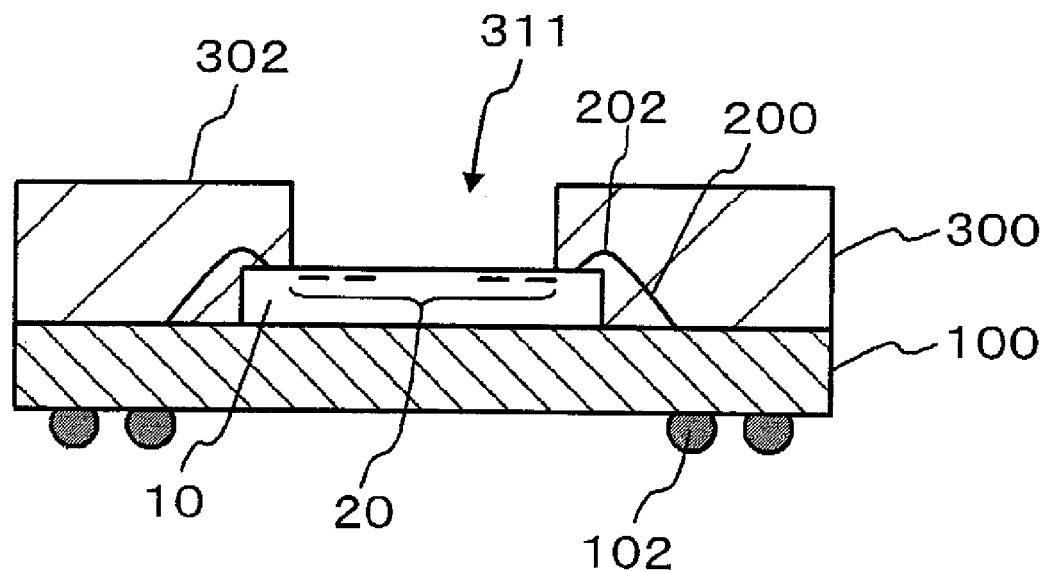

A-A'

SEMICONDUCTOR DEVICE INCLUDING A RECESS FORMED ABOVE A SEMICONDUCTOR CHIP

The present application is a Continuation Application of U.S. patent application Ser. No. 13/067,548, filed on Jun. 8, 2011 now U.S. Pat. No. 8,283,770, which is a Continuation Application of U.S. patent application Ser. No. 12/926,709, filed Dec. 6, 2010 now U.S. Pat. No. 7,982,303, which is based on and claims priority from Japanese patent application No. 2009-284350, filed on Dec. 15, 2009, the entire contents of which is incorporated herein by reference.

BACKGROUND

1. Technical Field

The present invention relates to a semiconductor device, which is obtained by disposing a semiconductor chip with an inductor on a mounting board and sealing it with resin, and a communication method.

2. Related Art

Communication between a semiconductor device and the outside is generally performed through a cable. In recent years, however, performing communication between a semiconductor device and the outside wirelessly by providing an inductor in a semiconductor chip and making the inductor inductively coupled to an external inductor has been studied.

For example, Japanese Unexamined patent publication NO. 2003-068941 discloses mounting a semiconductor chip with an inductor on a mounting board, connecting the semiconductor chip and the mounting board to each other using a bonding wire, and sealing the semiconductor chip and the bonding wire with a magnetic resin material.

In addition, Japanese Unexamined patent publication NO. 2007-066960 discloses embedding a heat dissipating member in an upper portion of a sealing resin layer which seals a bonding wire and a semiconductor chip on a mounting board.

In order to improve communication precision when performing communication by inductive coupling of two inductors, it is necessary to shorten the distance between the two inductors. In the case where one inductor is provided in a semiconductor chip and this inductor and an external inductor are inductively coupled to perform communication, the distance between the two inductors is increased if a sealing resin layer which seals the semiconductor chip is made to be thick. On the other hand, if the sealing resin layer is simply made to be thin, the physical protection function required of the sealing resin layer cannot be sufficiently guaranteed.

SUMMARY

In one embodiment, there is provided a semiconductor device including: a mounting board; a semiconductor chip disposed at a first surface of the mounting board; an inductor which is provided at a surface side of the semiconductor chip not facing the mounting board in order to perform communication between the semiconductor chip and the outside; a sealing resin layer which is formed at the first surface of the mounting board in order to seal the semiconductor chip; and a recess or an opening which is provided in the sealing resin layer and which includes the inductor inside when seen in a plan view.

According to the embodiment of the present invention, the recess or the opening is formed in the sealing resin layer. Moreover, the physical protection function required of the sealing resin layer can be guaranteed by making the sealing resin layer to be thick in a region other than the recess or the opening. In addition, the recess or the opening includes the inductor, which is provided in the semiconductor chip, thereinside when seen in a plan view. Accordingly, by locating an external inductor, which is a communication partner of the inductor provided in the semiconductor chip, in the recess or the opening, it is possible to shorten the distance between the inductor provided in the semiconductor chip and the external inductor.

In another embodiment, there is provided a communication method including: preparing a semiconductor device including a mounting board, a semiconductor chip disposed at a first surface of the mounting board, an inductor which is provided at a surface side of the semiconductor chip not facing the mounting board in order to perform communication between the semiconductor chip and the outside, a sealing resin layer which is formed at the first surface of the mounting board in order to seal the semiconductor chip, and a recess or an opening which is provided in the sealing resin layer and which includes the inductor inside when seen in a plan view; and performing communication between an external inductor, which is located in the recess or the opening of the semiconductor device so that the external inductor performs communication with the semiconductor device, and the inductor of the semiconductor device.

According to the embodiments of the present invention, the distance between an inductor provided in a semiconductor chip and an external inductor can be shortened without damaging the physical protection function required of a sealing resin layer.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 3A and 3B are cross-sectional views showing a method of manufacturing the semiconductor device shown in FIGS. 1 and 2;

FIG. 4 is a view showing a use state of the semiconductor device shown in FIGS. 1 and 2;

FIG. 5 is a cross-sectional view showing the configuration of a semiconductor device according to a second embodiment;

FIG. 6 is a cross-sectional view showing the configuration of a semiconductor device according to a third embodiment;

DETAILED DESCRIPTION

Figure 1:
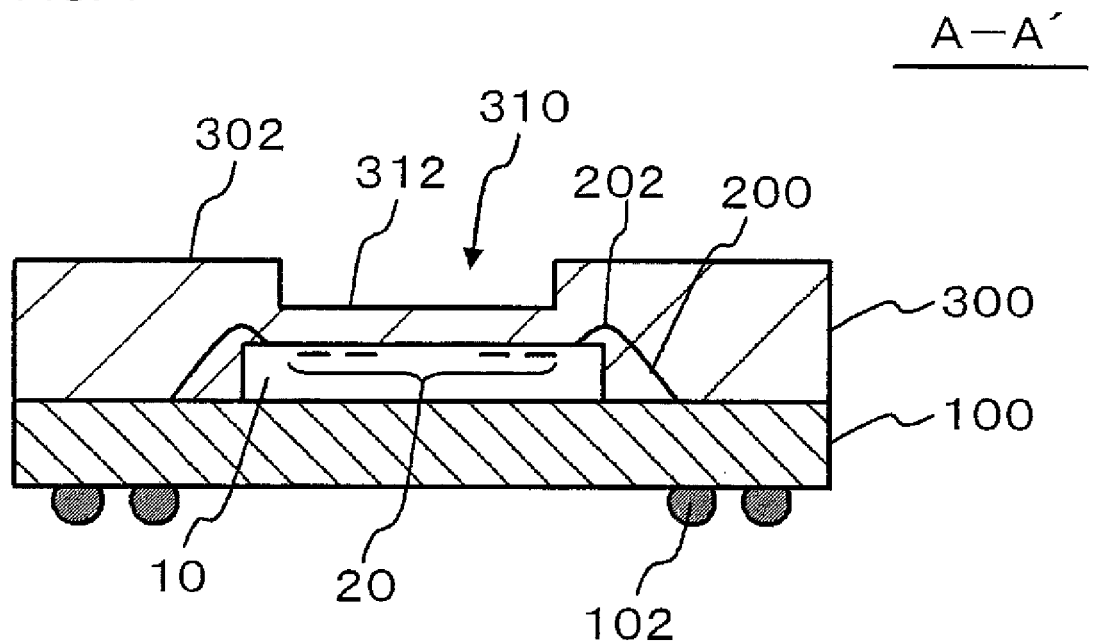
FIG. 1 is a cross-sectional view showing the configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In addition, the same components are denoted by the same reference numerals in all drawings, and the explanation will not be repeated.

Figure 2:
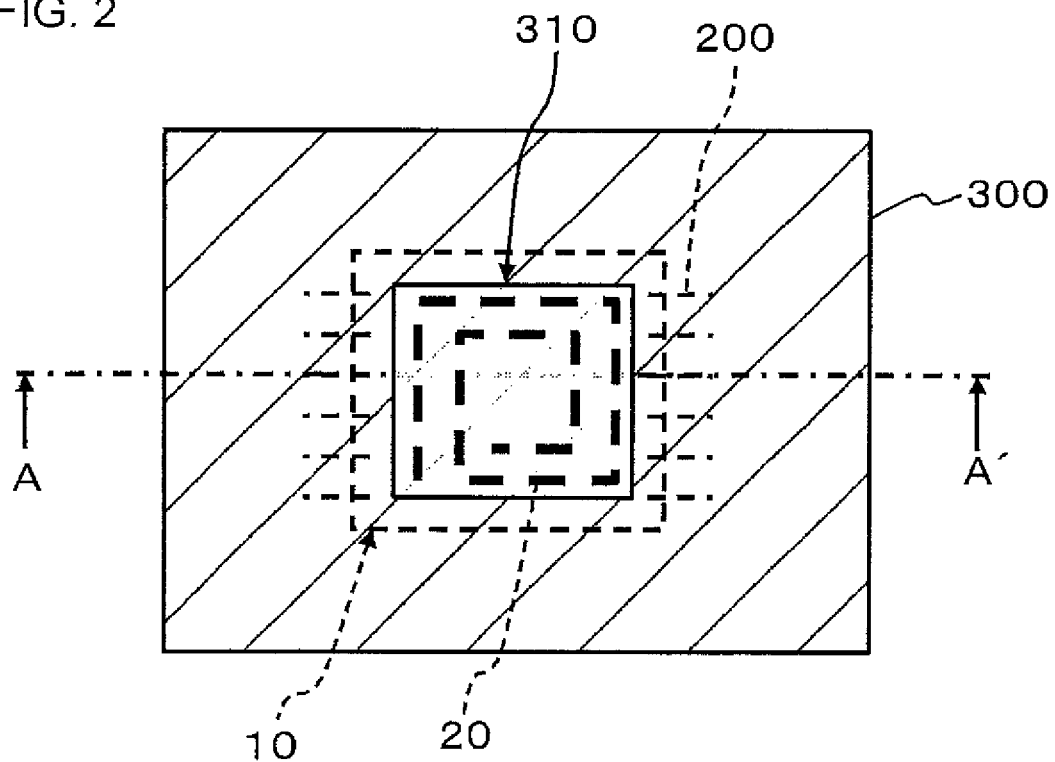
FIG. 2 is a plan view showing the semiconductor device shown in FIG. 1.

FIG. 1 is a cross-sectional view showing the configuration of a semiconductor device according to a first embodiment, and FIG. 2 is a plan view showing the semiconductor device shown in FIG. 1. FIG. 1 is equivalent to a cross-sectional view taken along the line A-A' of FIG. 2. This semiconductor device includes a mounting board 100, a semiconductor chip 10, an inductor 20, and a sealing resin layer 300. The semiconductor chip 10 is disposed on a first surface of the mounting board 100 with a mounting material (not shown), such as Ag paste or a DAF (Die Attach Film), interposed therebetween. The semiconductor chip 10 is disposed with its active surface upward. The inductor 20 is provided at the active surface side, that is, at the surface side of the semiconductor chip 10 not facing the mounting board in order to perform communication between the semiconductor chip 10 and the outside. The sealing resin layer 300 is formed on the first surface of the mounting board 100 in order to seal the semiconductor chip 10. In addition, a recess or an opening (in the present embodiment, a recess 310) is provided in the sealing resin layer 300. The recess 310 includes the inductor 20 thereinside when seen in a plan view. When seen in a plan view, the area of the recess 310 is equal to or more than 1% of the entire sealing resin layer 300 and equal to or less than 70% thereof, for example. Moreover, in the following plan views, the region of the sealing resin layer 300 where the recess 310 is formed is not hatched.

The entire region of the recess 310 is located inside the semiconductor chip 10 when seen in a plan view, and the recess 310 is not connected to any side surface of the sealing resin layer 300. The bottom surface 312 of the recess 310 is preferably formed as a flat surface. In particular, it is preferable that the bottom surface 312 is formed as a flat surface which is approximately parallel to the active surface of the semiconductor chip 10. Moreover, a top surface 302 (except for the recess 310) of the sealing resin layer 300 is a flat surface, and it is preferable that the bottom surface 312 of the recess 310 is also parallel to the top surface 302 of the sealing resin layer 300.

The semiconductor device has a plurality of bonding wires 200. The plurality of bonding wires 200 connects external connection terminals of the semiconductor chip 10, for example, electrode pads (not shown) to the mounting board 100. The recess 310 does not overlap any of the bonding wires 200. Moreover, when seen from the thickness direction of the sealing resin layer 300, the bottom surface 312 of the recess 310 is located closer to the top surface 302 of the sealing resin layer 300 than the apex 202 of the bonding wire 200. In addition, the bonding wire 200 is formed of at least one metal selected from a group including Au, Cu, and Al or contains at least one selected from the group as a main component (that is, more than 50% by weight).

Moreover, a plurality of external connection terminals 102, for example, a plurality of bumps formed of Sn—Ag—Cu is provided on the bottom surface of the mounting board 100. The external connection terminal 102 is connected to the semiconductor chip 10 through an interconnect (not shown) and a via (not shown), which are provided in the mounting board 100, and the bonding wire 200.

FIGS. 3A and 3B are cross-sectional views showing a method of manufacturing the semiconductor device shown in FIGS. 1 and 2. First, as shown in FIG. 3A, the mounting board 100 is prepared. In this state, the mounting board 100 has a shape in which portions which become a plurality of semiconductor devices are connected to each other. Then, the semiconductor chip 10 is disposed on the mounting board 100 for every portion which becomes a semiconductor device. Then, each of the plurality of semiconductor chips 10 is connected to an interconnect of the mounting board 100 using the bonding wire 200.

Then, the mounting board 100, in a state where the semiconductor chip 10 is mounted, is disposed in a lower mold 410 which is a sealing die. Then, an upper mold 400 corresponding to the lower mold 410 is disposed on the lower mold 410 and the mounting board 100. A plurality of protrusions 402 is provided in the ceiling portion of the inner surface of the upper mold 400. The protrusion 402 has a flat tip. This flat portion overlaps the inductor 20 of the semiconductor chip 10 when seen in a plan view. In addition, there is a gap between the tip of the protrusion 402 and the active surface of the semiconductor chip 10.

Subsequently, sealing resin is injected into the space between the lower mold 410 and the upper mold 400. As a result, the sealing resin layer 300 is formed. In this state, the sealing resin layer 300 is not formed in a portion where the protrusion 402 is located.

Then, as shown in FIG. 3B, the lower mold 410 and the upper mold 400 are removed. In this state, the recess 310 is formed in a portion of the sealing resin layer 300 where the protrusion 402 of the upper mold 400 is located. Then, the external connection terminal 102 is formed. Then, the mounting board 100 is cut by moving the dicing blade 420 along the dicing line. As a result, the plurality of semiconductor devices is cut and separated from each other.

FIG. 4 is a view showing a use state of the semiconductor device shown in FIGS. 1 and 2. This semiconductor device is used paired with an electronic device 500. The electronic device 500 has a communication head 510. The communication head 510 has an inductor 512. When seen in a plan view, the communication head 510 is smaller than the recess 310. By locating the communication head 510 inside the recess 310, the inductor 512 and the inductor 20 face each other so as to be inductively coupled. Accordingly, communication is performed between the semiconductor device and the electronic device 500.

In addition, the electronic device 500 has a moving mechanism (not shown) for locating the communication head 510 in the recess 310 and moving it back from the recess 310.

Next, operations and effects of the present embodiment will be described. Physical protection functions required of the sealing resin layer 300 include a function of protecting the semiconductor chip 10 against damage or deformation, a function of preventing the permeation of moisture into a semiconductor device, and a function of increasing the rigidity of the entire semiconductor device in order to make handling of the semiconductor device easy. In addition, the sealing resin layer 300 has a function of ensuring the insulation between wires or electrodes in a semiconductor device, a function of ensuring the insulation between the inside and the outside of a semiconductor device, and a function as a stamp region where the product information is displayed.

In the present embodiment, the recess 310 is formed in the sealing resin layer 300. Moreover, the above-described functions required of the sealing resin layer 300 can be guaranteed by thickening the sealing resin layer 300 in a region other than the recess 310. In addition, by setting a region of the sealing resin layer 300 excluding the recess 310 as a stamp region where the product information is displayed, it is possible to prevent the exposure of at least one of the semiconductor chip 10 and the bonding wire 200 from the sealing resin layer 300, for example, when placing a stamp by partially excavating the sealing resin layer 300 such as in laser stamping.

In addition, the recess 310 includes the inductor 20, which is provided in the semiconductor chip 10, thereinside when seen in a plan view. Accordingly, the distance between the inductor 20 and the inductor 512 can be reduced by locating the inductor 512, which is a communication partner of the inductor 20, in the recess 310.

Moreover, in the present embodiment, the recess 310 is not connected to any side surface of the sealing resin layer 300. For this reason, the entire peripheral edge of the sealing resin layer 300 can be made to be thick. Accordingly, since the peripheral edge of the sealing resin layer 300 functions as a protective portion of the recess 310, the ease of handling of a semiconductor device is not reduced even if the recess 310 is provided.

In addition, since the entire peripheral edge of the sealing resin layer 300 can be made to be thick, a reduction in the rigidity of the overall semiconductor device caused by the recess 310 can be suppressed. Accordingly, it is possible to suppress a reduction in the productivity of the semiconductor device caused by warpage of the mounting board 100 or the semiconductor device in the step before the mounting board 100 is divided into semiconductor devices, in a reflow process during soldering, and the like.

In addition, there is a variation in the height of the apex 202 of the bonding wire 200. Accordingly, if the recess 310 overlaps the bonding wire 200, the apex 202 of the bonding wire 200 may be exposed from the sealing resin layer 300. On the other hand, in the present embodiment, since the recess 310 does not overlap the bonding wire 200 as described above, exposure of the apex 202 of the bonding wire 200 from the sealing resin layer 300 can be prevented.

Resin which forms the sealing resin layer 300 includes filler formed of $SiO_2$ or the like. In the filler, there are variations in particle diameter. Moreover, if filler with a large particle diameter is located below the recess 310, the surface of the semiconductor chip 10 or the bonding wire 200 may be damaged by the filler. On the other hand, in the present embodiment, the recess 310 is smaller than the semiconductor chip 10 when seen in a plan view, and the entire region of the recess 310 is located in the semiconductor chip 10. Therefore, compared with the case where the recess 310 is made larger than the semiconductor chip 10 or the case where the entire sealing resin layer 300 is made thin, it is possible to prevent the surface of the semiconductor chip 10 from being damaged by filler. In addition, since the recess 310 does not overlap the bonding wire 200, it is also possible to prevent the bonding wire 200 from being damaged by filler.

FIG. 5 is a cross-sectional view showing the configuration of a semiconductor device according to a second embodiment and is equivalent to FIG. 1 in the first embodiment. The semiconductor device according to the present embodiment has the same configuration as the semiconductor device according to the first embodiment except that the recess 310 is formed deep and the bottom surface 312 of the recess 310 is located closer to the semiconductor chip 10 than the apex 202 of the bonding wire 200 when seen from the thickness direction of the sealing resin layer 300.

Also in the present embodiment, the same effects as in the first embodiment can be achieved. In addition, since the bottom surface 312 of the recess 310 is located closer to the semiconductor chip 10, the distance between the inductor 20 and an external inductor can be further shortened.

FIG. 6 is a cross-sectional view showing the configuration of a semiconductor device according to a third embodiment and is equivalent to FIG. 1 in the first embodiment. The semiconductor device according to the present embodiment has the same configuration as the semiconductor device according to the first embodiment except that an opening 311 is provided in the sealing resin layer 300 instead of the recess 310.

The opening 311 can be formed by increasing the height of the protrusion 402 shown in FIG. 3A so that the tip of the protrusion 402 comes in contact with the active surface of the semiconductor chip 10. Moreover, in the present embodiment, if the protrusion 402 is fixed to the body of the upper mold 400 through an elastic body (for example, a spring) or the protrusion 402 is formed of an elastic material, it is possible to prevent the semiconductor chip 10 from being damaged when the tip of the protrusion 402 comes in contact with the active surface of the semiconductor chip 10.

Also in the present embodiment, the same effects as in the first embodiment can be achieved. In addition, since the sealing resin layer 300 is not formed in a portion located above the inductor 20, the distance between the inductor 20 and an external inductor can be further shortened.

Figure 7:
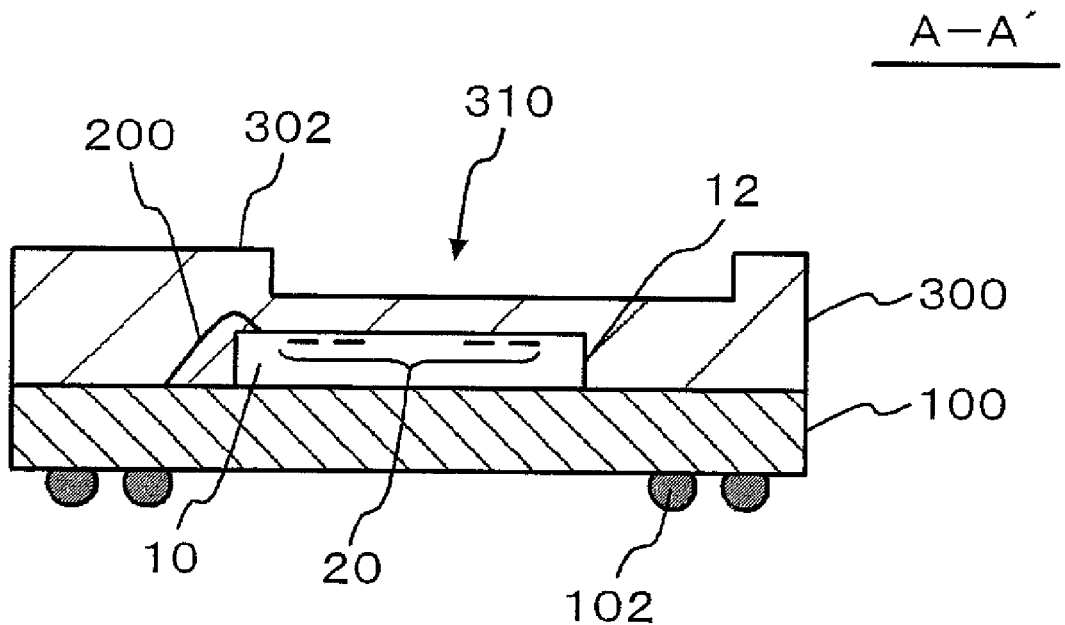
FIG. 7 is a cross-sectional view showing the configuration of a semiconductor device according to a fourth embodiment.
Figure 8:
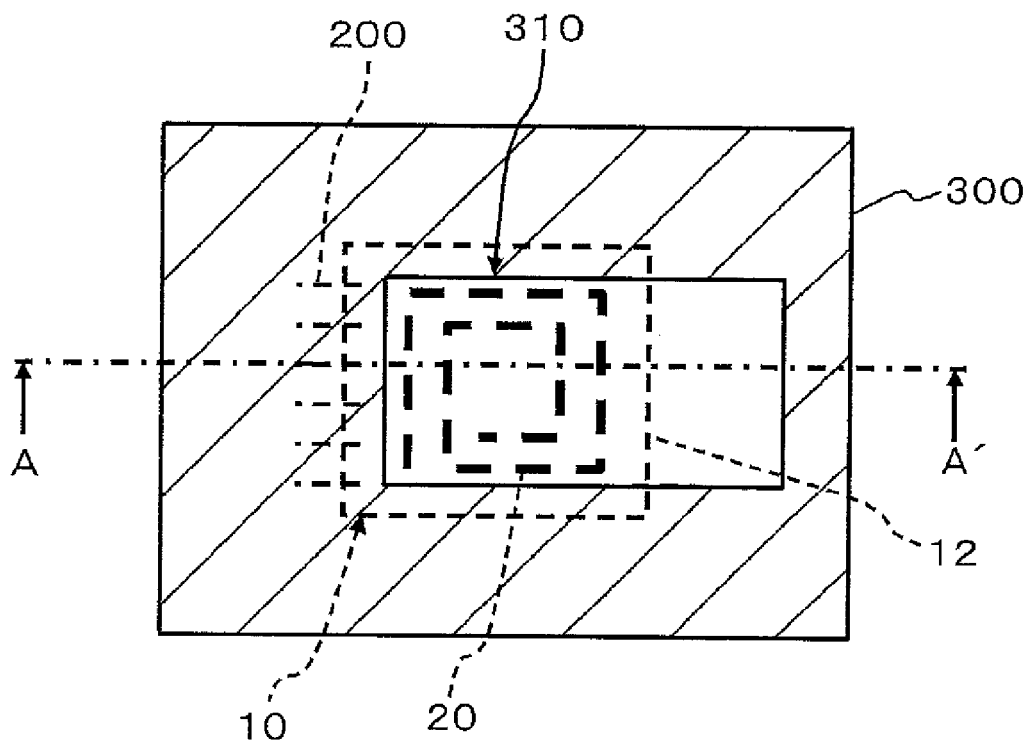
FIG. 8 is a plan view showing the semiconductor device shown in FIG. 7.

FIG. 7 is a cross-sectional view showing the configuration of a semiconductor device according to a fourth embodiment, and FIG. 8 is a plan view showing the semiconductor device shown in FIG. 7. FIGS. 7 and 8 are equivalent to FIGS. 1 and 2 in the first embodiment, respectively. The semiconductor device according to the present embodiment has the same configuration as the semiconductor device according to the first embodiment except that the recess 310 is provided over one side 12 of the semiconductor chip 10 when seen in a plan view. The bonding wire 200 is not connected to at least the region of the one side 12 of the semiconductor chip 10 overlapping the recess 310.

Also in the present embodiment, the same effects as in the first embodiment can be achieved. In addition, since the planar shape of the recess 310 can be made larger than in the first embodiment, it becomes easy to locate the inductor 512 (shown in FIG. 4) communicating with the inductor 20 in the recess 310. In addition, since the degree of freedom in the layout of the recess 310 is improved, the degree of freedom in the shape or arrangement of the communication head 510 (shown in FIG. 4) which has the inductor 512 is improved.

Figure 9:
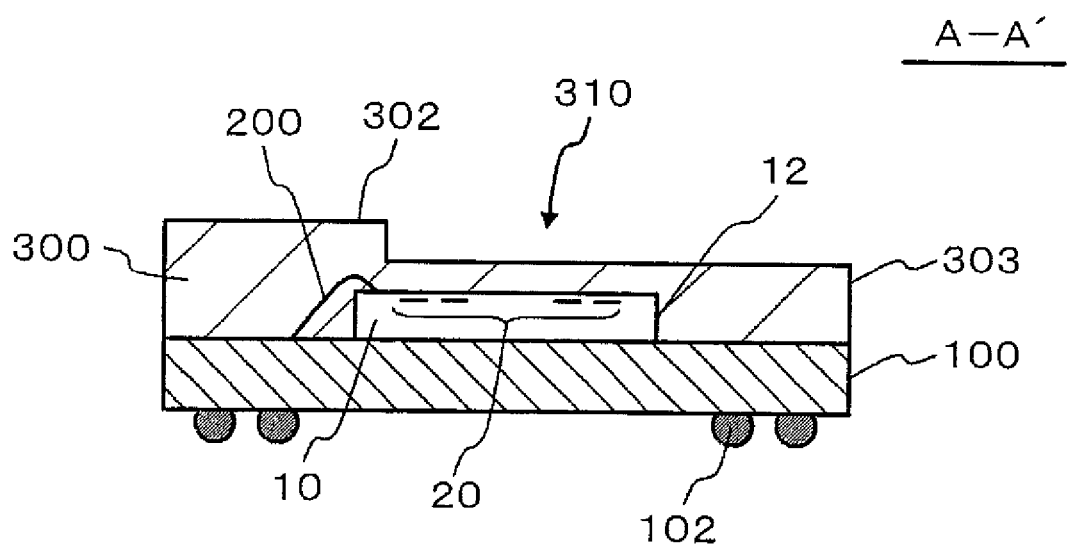
FIG. 9 is a cross-sectional view showing a first modification of the semiconductor device shown in FIG. 7.
Figure 10:
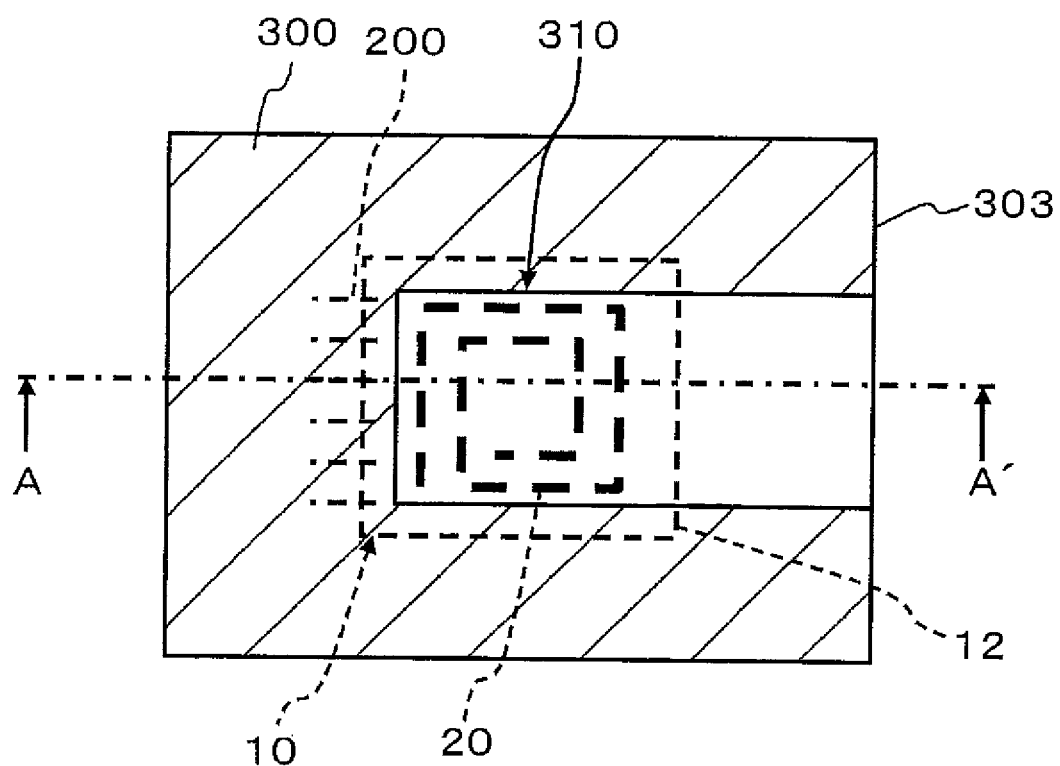
FIG. 10 is a plan view showing the semiconductor device shown in FIG. 9.

Moreover, in the present embodiment, the recess 310 may be connected to a side surface 303 of the sealing resin layer 300 as shown in a cross-sectional view of FIG. 9 and a plan view of FIG. 10. In this case, the communication head 510 (shown in FIG. 4) with the inductor 512 can be made to face the inductor 20 of the semiconductor chip 10 by sliding the communication head 510 in parallel to the mounting board 100 from the side surface 303 side. Therefore, it is possible to make the inductor 512 face the inductor 20 even if a moving mechanism, which moves the communication head 510 up and down, is not provided in the electronic device 500 (shown in FIG. 4).

In addition, the recess 310 shown in FIGS. 9 and 10 may be formed by arranging the protrusion 402 shown in FIG. 3A at a position overlapping a dicing line.

Figure 11:
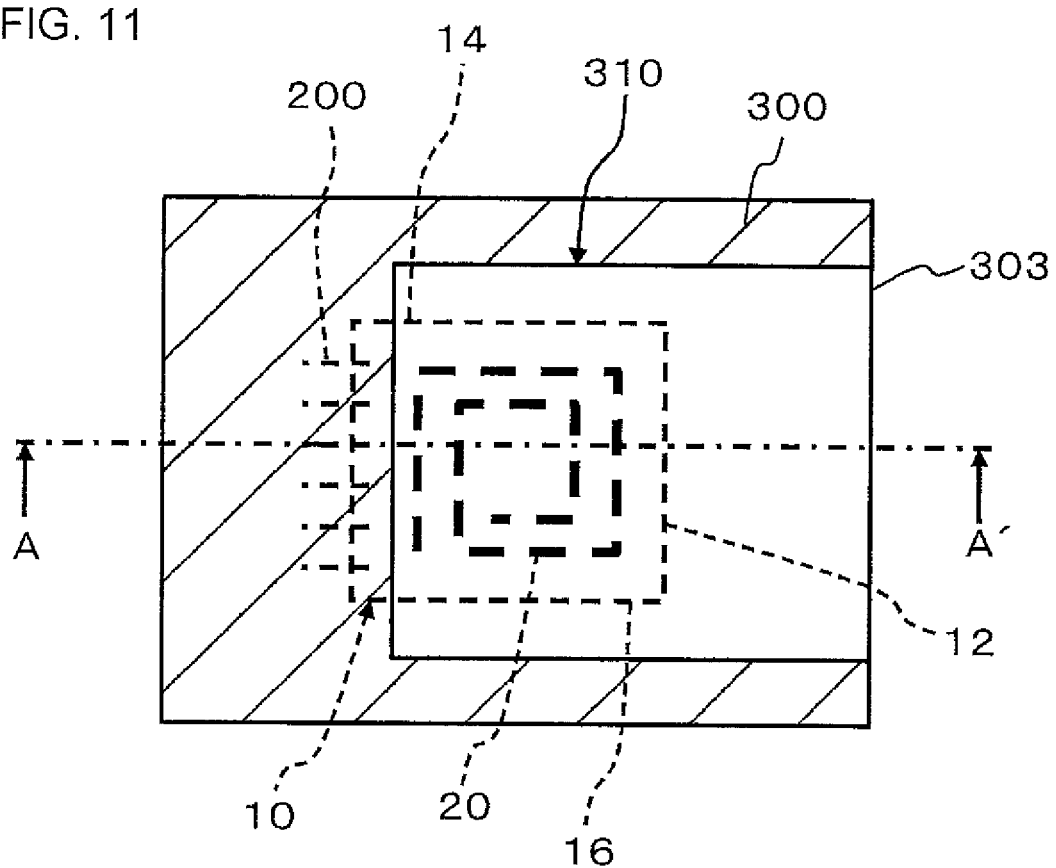
FIG. 11 is a plan view showing a second modification of the semiconductor device shown in FIG. 7.

In addition, as shown in a plan view of FIG. 11, the recess 310 may be formed over two opposite sides 14 and 16 of the semiconductor chip 10.

Figure 12:
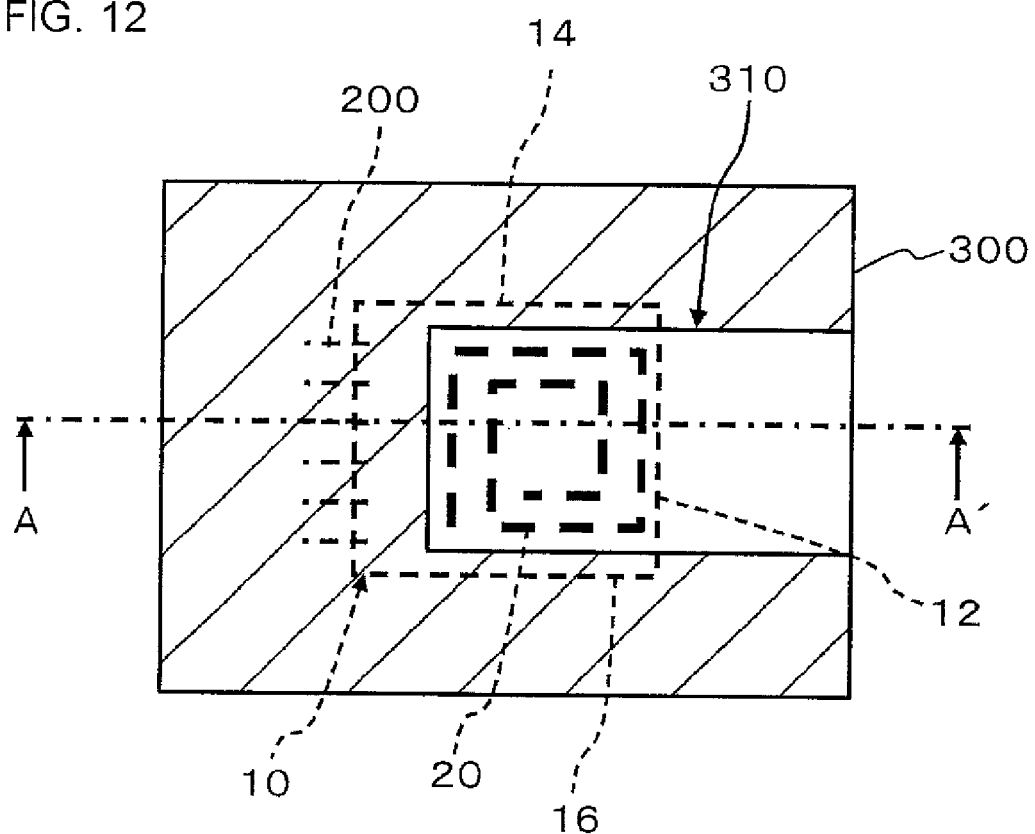
FIG. 12 is a plan view showing a third modification of the semiconductor device shown in FIG. 7.

In addition, as shown in a plan view of FIG. 12, the middle of the inductor 20 may be brought close to the one side 12 of the semiconductor chip 10. In this case, since the area of the recess 310 can be made small, a reduction in the strength of the sealing resin layer 300 can be further suppressed. In addition, a stamp region where the product information is displayed can be ensured over a wide area.

Figure 13:
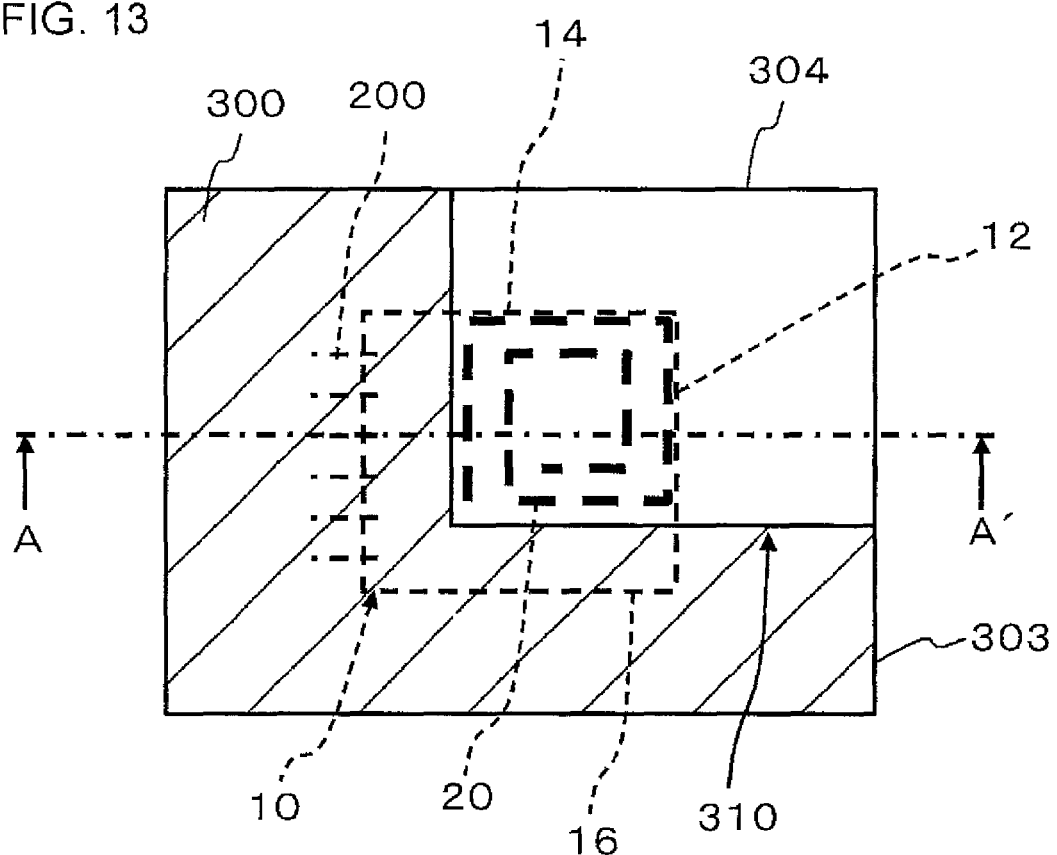
FIG. 13 is a plan view showing a fourth modification of the semiconductor device shown in FIG. 7.

In addition, as shown in a plan view of FIG. 13, the recess 310 may be formed so as to be connected not only to the side surface 303 of the sealing resin layer 300 but also to another side surface 304 connected to the side surface 303 and the apex formed by the side surfaces 303 and 304.

Figure 14:
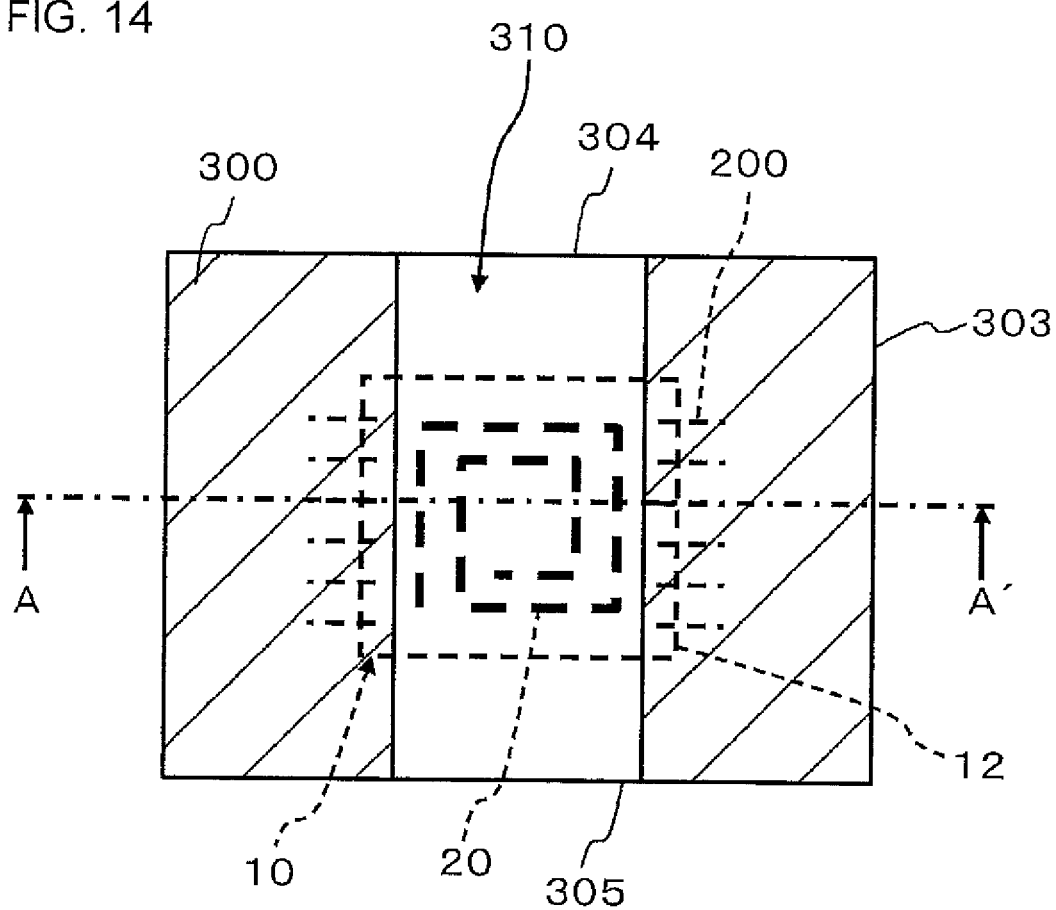
FIG. 14 is a plan view showing a fifth modification of the semiconductor device shown in FIG. 7.

In addition, as shown in a plan view of FIG. 14, the recess 310 may be formed so as to be connected to both of two opposite side surfaces 304 and 305 of the sealing resin layer 300.

Figure 15:
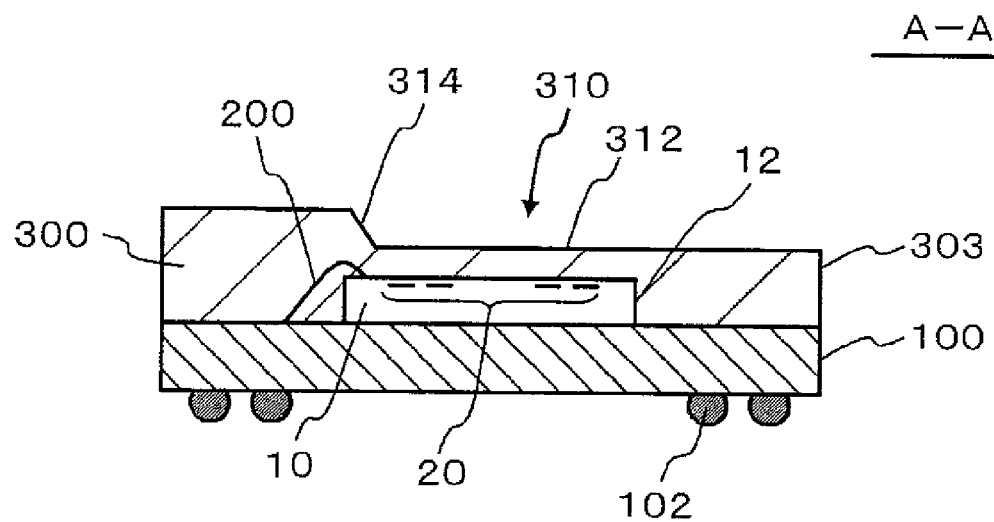
FIG. 15 is a cross-sectional view showing a sixth modification of the semiconductor device shown in FIG. 7.

In addition, as shown in a cross-sectional view of FIG. 15, the side surface 314 of the recess 310 may be inclined in a direction in which the area of the bottom surface 312 is smaller than the opening area of the recess. In this case, when forming the sealing resin layer 300, the protrusion 402 shown in FIG. 3A is easily separated from the sealing resin layer 300.

Figure 16:
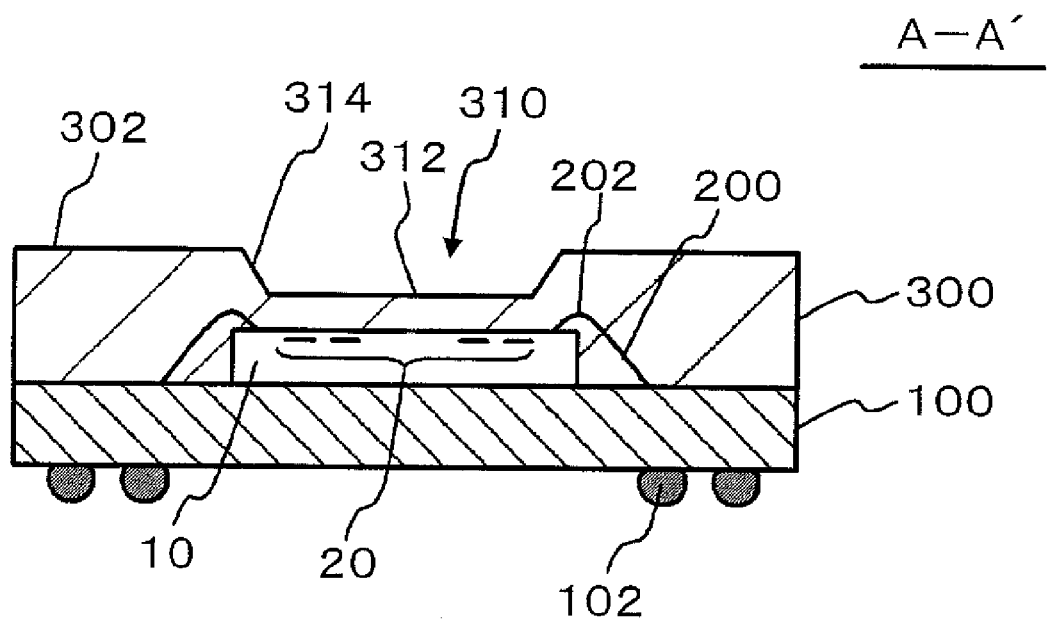
FIG. 16 is a cross-sectional view showing the configuration of a semiconductor device according to a fifth embodiment.

FIG. 16 is a cross-sectional view showing the configuration of a semiconductor device according to a fifth embodiment and is equivalent to FIG. 1 in the first embodiment. The semiconductor device according to the present embodiment has the same configuration as the semiconductor device according to the first embodiment except that the side surface 314 of the recess 310 is inclined in a direction protruding inward and the area of the bottom surface 312 is smaller than the opening area of a recess.

Figure 17:
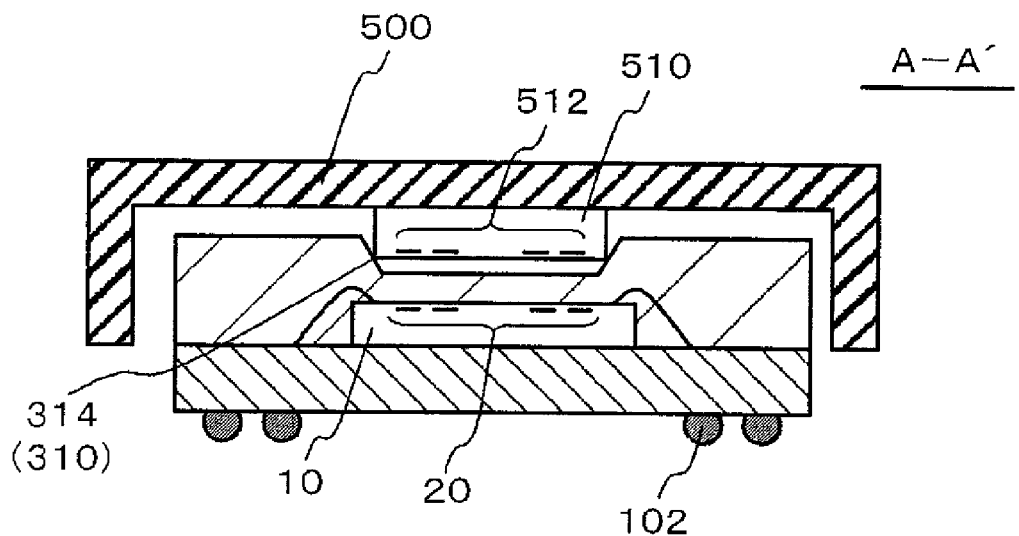
FIG. 17 is a cross-sectional view showing a use state of the semiconductor device shown in FIG. 16.

FIG. 17 is a cross-sectional view showing a use state of the semiconductor device shown in FIG. 16. As shown in FIGS. 16 and 17, since the side surface 314 of the recess 310 is inclined, the side surface 314 can function as a positioning portion of the communication head 510. That is, the communication head 510 is precisely positioned in a three-dimensional manner since the communication head 510 is inserted in the recess 310 until it comes in contact with the side surface 314.

Therefore, according to the present embodiment, not only the same effects as in the first embodiment can be achieved, but also the inductor 512 of the communication head 510 can be made to face the inductor 20 of the semiconductor chip 10. As a result, a reduction in the coupling coefficient between the inductors 20 and 512 can be suppressed. In addition, it is possible to prevent the communication head 510 from erroneously being in contact with the bottom surface 312 of the recess 310.

Moreover, since the boundary between the side surface 314 of the recess 310 and the top surface 302 of the sealing resin layer 300 can be made to have an obtuse angle, the occurrence of cracking in this portion can be prevented. In addition, since the side surface 314 is inclined, the protrusion 402 shown in FIG. 3A is easily separated from the sealing resin layer 300 when forming the sealing resin layer 300.

Figure 18:
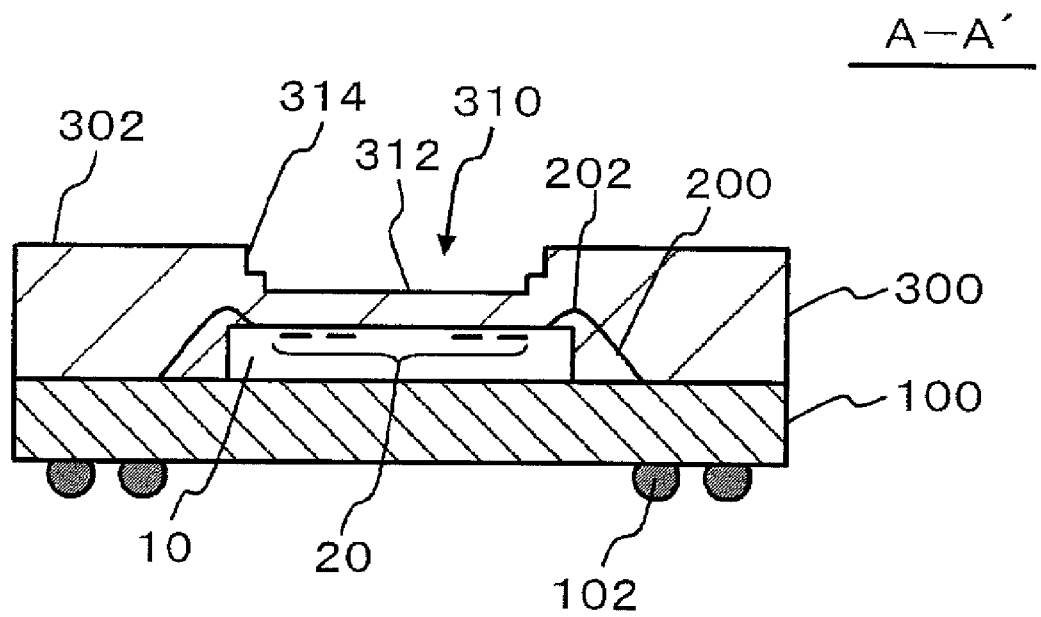
FIG. 18 is a cross-sectional view showing the configuration of a semiconductor device according to a sixth embodiment.

FIG. 18 is a cross-sectional view showing the configuration of a semiconductor device according to a sixth embodiment and is equivalent to FIG. 16 in the fifth embodiment. The semiconductor device according to the present embodiment has the same configuration as the semiconductor device according to the fifth embodiment except that the side surface 314 of the recess 310 is formed in a stepwise manner over the entire periphery.

Also in the present embodiment, the same effects as in the first embodiment can be achieved. Moreover, since the stepped portion of the side surface 314 of the recess 310 protrudes to the inside of the recess 310, the inductor 512 of the communication head 510 and the inductor 20 of the semiconductor chip 10 can be made to face each other with high precision by making the communication head 510 (shown in FIG. 17) come in contact with the stepped portion. As a result, a reduction in the coupling coefficient between the inductors 20 and 512 can be suppressed. In addition, it is possible to prevent the communication head 510 from erroneously being in contact with the bottom surface 312 of the recess 310.

Figure 19:
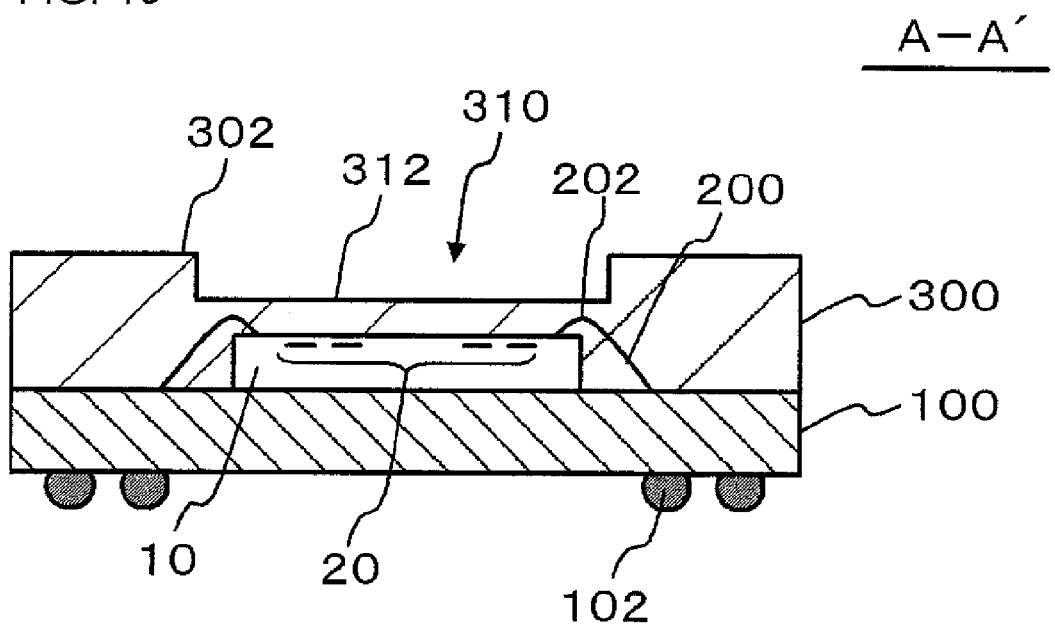
FIG. 19 is a cross-sectional view showing the configuration of a semiconductor device according to a seventh embodiment.

FIG. 19 is a cross-sectional view of a semiconductor device according to a seventh embodiment and is equivalent to FIG. 1 in the first embodiment. The semiconductor device according to the present embodiment has the same configuration as the semiconductor device according to the first embodiment except that the recess 310 overlaps at least a part of the bonding wire 200, for example, a portion including the apex 202 when seen in a plan view.

Also in the present embodiment, each function required of the sealing resin layer 300 can be guaranteed by making the sealing resin layer 300 thick in a region other than the recess 310. In addition, the distance between the inductor 20 and the inductor 512 can be reduced by locating the inductor 512 (shown in FIG. 17), which is a communication partner of the inductor 20, in the recess 310. In addition, a reduction in the rigidity of the entire semiconductor device caused by the recess 310 can be suppressed.

Figure 20:
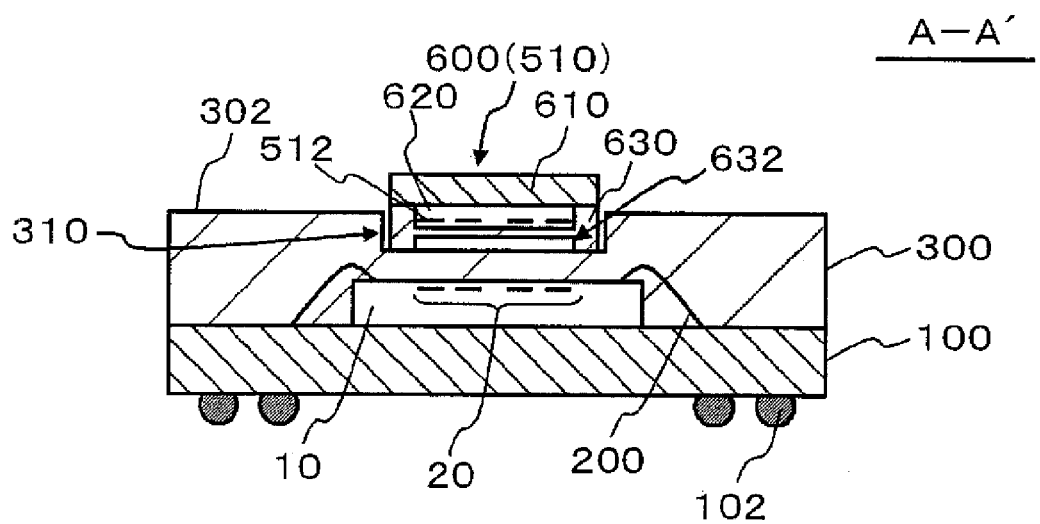
FIG. 20 is a cross-sectional view showing a use state of a semiconductor device according to an eighth embodiment.

FIG. 20 is a cross-sectional view for explaining a use state of a semiconductor device according to an eighth embodiment. In FIG. 20, a semiconductor device 600 which is a part of the communication head 510 is located in the recess 310 of the semiconductor device. The semiconductor device 600 has a configuration in which a semiconductor chip 620 with an inductor 512 is mounted on a mounting board 610 and the semiconductor chip 620 on the mounting board 610 is sealed by a sealing resin layer 630. A recess 632 is formed in a surface layer of the sealing resin layer 630. The recess 632 includes the inductor 512 thereinside when seen in a plan view.

According to the present embodiment, the semiconductor device 600 which is a communication partner of the semiconductor chip 10 has the same configuration as the semiconductor device with the semiconductor chip 10 even though their sizes are different. Accordingly, the semiconductor device 600 and the semiconductor device with the semiconductor chip 10 can be treated and manufactured as the same modules. In addition, since the recess 632 is also formed in the sealing resin layer 630 of the semiconductor device 600, attenuation of the magnetic field generated between the inductors 512 and 20, which is caused by the sealing resin layer 630, can be suppressed. Accordingly, a possibility that a communication error will occur between the inductors 512 and 20 is low.

Figure 21:
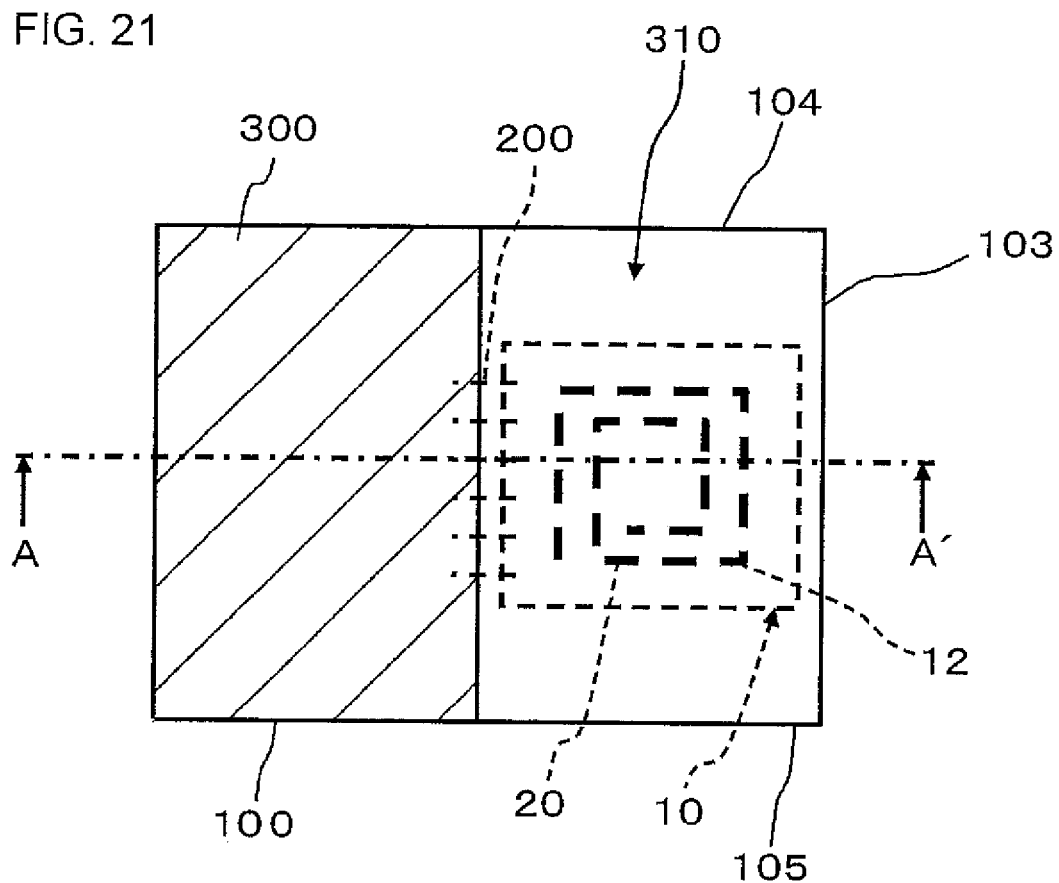
FIG. 21 is a plan view showing the configuration of a semiconductor device according to a ninth embodiment.

FIG. 21 is a plan view showing the configuration of a semiconductor device according to a ninth embodiment. This semiconductor device has the same configuration as the semiconductor device shown in FIG. 13 except for the following points.

First, when seen in a plan view, the recess 310 is formed so as to be connected to two adjacent apices of the mounting board 100, a side 103 which has the two apices at both ends, and parts of sides 104 and 105 which have the two apices as one end, respectively. Moreover, in FIG. 21, the middle of the semiconductor chip 10 is located closer to the side 103 than the middle of the mounting board 100.

Figure 22:
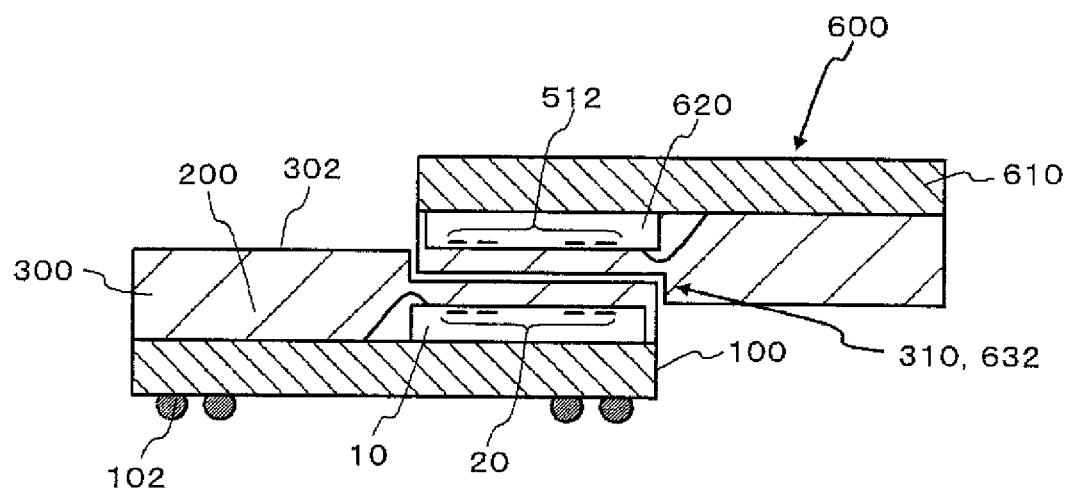
FIG. 22 is a cross-sectional view showing a use state of the semiconductor according to the sixth embodiment.

FIG. 22 is a view showing the section taken along the line A-A' of FIG. 21 together with the semiconductor device 600 which is a communication partner. In FIG. 22, the same reference numerals as in FIG. 20 are used to denote constituent components of the semiconductor device 600. In FIG. 22, the semiconductor device 600 has the same configuration as the semiconductor device shown in FIG. 21 leaving the size apart. Accordingly, the semiconductor device with the semiconductor chip 10 and the semiconductor device 600 can be made to face each other such that the recesses 310 and 632 overlap each other. In this manner, since the distance between the inductors 20 and 512 can be further shortened, the possibility is low that a communication error will occur even if the inductors 20 and 512 are made to be small.

Moreover, in the present embodiment, if one of the semiconductor device with the semiconductor chip 10 and the semiconductor device 600 is larger than the other, the configuration of a sealing resin layer of the one semiconductor device may be made as the configuration shown in FIGS. 9 and 10. Also in this case, as shown in FIG. 22, the semiconductor device with the semiconductor chip 10 and the semiconductor device 600 can be made to face each other such that the recesses 310 and 632 overlap each other.

While the embodiments of the present invention have been described with reference to the drawings, these are only illustrations of the present invention, and various other configurations may also be adopted. For example, in each of the embodiments described above, a dummy recess may be provided in the sealing resin layer 300. Preferably, the dummy recess is provided at the position which is point-symmetric or line-symmetric with the recess 310 with respect to the middle of the sealing resin layer 300. In this way, thermal stress caused by the recess 310 can be reduced by the dummy recess.

In addition, elements (for example, semiconductor chips) other than the semiconductor chip 10 may be mounted on the mounting board 100, or a plurality of semiconductor chips 10 may be mounted on the mounting board 100. In this case, it is preferable that the sealing resin layer 300 seals the semiconductor chip 10 and other elements simultaneously. In addition, when the plurality of semiconductor chips 10 is mounted, some semiconductor chips 10 may be used for signal transmission and the remaining semiconductor chips 10 may be used for signal reception.

Moreover, although the semiconductor device has a Ball Grid Array (BGA) structure in each of the embodiments described above, it is also possible to adopt a Quad Flat Package (QFP) structure, a Pin Grid Array (PGA) structure, a Land Grid Array (LGA) structure, a Dual Inline Package (DIP) structure, or a module in which the semiconductor chip 10 and other components are provided on the same mounting board 100. Alternatively, it is also possible to adopt a Chip On Chip structure in which the semiconductor chip 10 is mounted on another semiconductor chip.

Particularly in the case of the PGA structure, the LGA structure, or the DIP structure, a variation in the fixed height when mounting the semiconductor chip 10 on the mounting board 100 can be reduced. As a result, the precision of the height of the inductor 20, that is, the precision of the distance between the inductors 20 and 512 can be improved.

Moreover, in the case of a module, the mounting position of the semiconductor chip 10 with the inductor 20 may vary. In this case, the precision of the relative position between the inductors 20 and 512 can be improved by using the recess 310 of the sealing resin layer 300 as a reference for positioning. Moreover, when a component thicker than the semiconductor chip 10 is mounted on the mounting board 100 together with the semiconductor chip 10, it is necessary to thicken the sealing resin layer 300. In this case, however, an increase in the distance between the inductors 20 and 512 can be suppressed by providing the recess 310.

In addition, when forming the opening 311, it is possible to dispose a dummy block over the semiconductor chip 10 in advance and to remove the dummy block after forming the sealing resin layer 300, instead of forming the protrusion 402 in the upper mold 400. In this case, since the position of the dummy block can be set with the semiconductor chip 10 as a reference, the precision of the relative position of the opening 311 to the inductor 20 can be improved. In addition, an elastic body is preferable as a dummy block.

Moreover, the recess 310 may be formed by forming the upper surface of the sealing resin layer 300 to be flat and then removing a part of the upper surface of the sealing resin layer 300, instead of forming the protrusion 402 in the upper mold 400 when forming the recess 310.

Moreover, a capacitance coupling type element, such as an electrode plate, may be provided instead of the inductor 20.

It is apparent that the present invention is not limited to the above embodiments, but may be modified and changed without departing from the scope and spirit of the invention.

What is claimed is:

1. A semiconductor device, comprising:
a substrate with a first surface;
a semiconductor chip disposed over the first surface of the substrate, the semiconductor chip comprising a first region and a second region; and
an encapsulant resin formed over the first surface of the substrate and encapsulating the semiconductor chip,
wherein the encapsulant resin has a thickness that is less at the first region of the semiconductor chip than that at the second region.

2. The semiconductor device as set forth in claim 1, wherein a top surface of the encapsulant resin comprises no stamp above the first region and comprises a stamp above the second region.

3. The semiconductor device as set forth in claim 2, wherein the stamp is formed by a partial excavating of the top surface of the encapsulant resin.

4. The semiconductor device as set forth in claim 3, wherein the first surface of the substrate comprises a first substrate region, and
wherein the top surface of the encapsulant resin above the first substrate region is in a same surface as the top surface of the encapsulant resin above the second region of the semiconductor chip.

5. The semiconductor device as set forth in claim 4, wherein the semiconductor chip comprises:
a first chip surface facing the substrate;

a second chip surface opposite to the first chip surface; and
a chip electrode disposed at the second chip surface,
wherein the substrate comprises a first substrate electrode, the first substrate electrode being disposed at the first surface, the semiconductor device further comprising a wire, the wire connecting the chip electrode to the first substrate electrode.

6. The semiconductor device as set forth in claim 5, wherein the chip electrode connected to the wire is disposed in the second region of the semiconductor chip.

7. The semiconductor device as set forth in claim 6, wherein the substrate further comprises a second substrate electrode, the second substrate electrode being disposed at a second surface of the substrate opposite to the first surface.

8. The semiconductor device as set forth in claim 7, wherein the semiconductor chip comprises an inductor in the first region and comprises no inductor in the second region.

9. The semiconductor device as set forth in claim 1, wherein the thickness of the encapsulant resin disposed on an upper surface of the semiconductor chip varies above the semiconductor chip.

10. The semiconductor device as set forth in claim 1, wherein a first region of an upper surface of the semiconductor chip is within the first region and a second region of the upper surface of the semiconductor chip is within the second region.

11. The semiconductor device as set forth in claim 1, wherein a recess is provided in the encapsulant resin such that, in a cross sectional view, side surfaces of the recess extend above an upper surface of the semiconductor chip.

12. The semiconductor device as set forth in claim 11, wherein, in a plan view, an entirety of the recess is located inside the semiconductor chip.

13. The semiconductor device as set forth in claim 11, further comprising an inductor disposed below the upper surface of the semiconductor chip for communicating with outside of the semiconductor device.

14. The semiconductor device as set forth in claim 13, wherein, in a plan view, an entirety of the recess and an entirety of the inductor are located inside the semiconductor chip.

15. The semiconductor device as set forth in claim 11, wherein the semiconductor device further comprises a wire connecting the second region of the semiconductor chip electrode to the first substrate.

16. The semiconductor device as set forth in claim 15, wherein, in a plan view, an entirety of the wire is located outside of the recess.

* * * * *